United States Patent [19]

Anderson, Jr. et al.

[11] Patent Number: 4,885,038

[45] Date of Patent: Dec. 5, 1989

[54] METHOD OF MAKING MULTILAYERED CERAMIC STRUCTURES HAVING AN INTERNAL DISTRIBUTION OF COPPER-BASED CONDUCTORS

[75] Inventors: Herbert R. Anderson, Jr., Patterson, N.Y.; Renuka S. Divakaruni, Ridgefield, Conn.; Joseph M. Dynys, Poughkeepsie, N.Y.; Steven M. Kandetzke, Fishkill, N.Y.; Daniel P. Kirby, Poughkeepsie, N.Y.; Raj N. Master, Wappingers Falls, N.Y.; Jon A. Casey, Poughkeepsie, N.Y.

[73] Assignee: International Business Machines Corporation, Armonk, N.Y.

[21] Appl. No.: 858,488

[22] Filed: May 1, 1986

[51] Int. Cl.$^4$ .................. B32B 31/24; C04B 33/32
[52] U.S. Cl. ............................. 156/89; 264/61; 264/63
[58] Field of Search ................. 264/61, 63; 156/89

[56] References Cited

U.S. PATENT DOCUMENTS

| | | | |
|---|---|---|---|
| 4,079,156 | 3/1978 | Youtsey et al. | 252/512 |
| 4,234,367 | 11/1980 | Herron et al. | 156/89 |
| 4,439,255 | 3/1984 | Imai et al. | 156/89 |
| 4,474,731 | 10/1984 | Brownlow et al. | 264/63 |
| 4,504,339 | 3/1985 | Kamehara et al. | 156/89 |
| 4,517,155 | 5/1985 | Prakash et al. | 252/512 |
| 4,551,357 | 11/1985 | Takeuchi | 427/96 |
| 4,671,928 | 6/1987 | Herron et al. | 419/10 |

OTHER PUBLICATIONS

Best et al., Use of Boric Acid Solution with Glass and Copper, IBM Technical Disclosure Bulletin, vol. 15, No. 11 (Apr. 73).

*Primary Examiner*—James Derrington
*Attorney, Agent, or Firm*—Anne V. Dougherty; Ira D. Blecker

[57] ABSTRACT

The present invention provides a method for producing multilayered ceramic structures having copper-based conductors therein, wherein the onset of sintering of the copper-based conductor can be adjusted to approach or match that of the ceramic portion of the structure. In addition, methods are provided whereby the polymeric binder resin used in formation of the ceramic portion of the structure can be removed or burned-off, using oxygen-containing ambients, wherein the oxygen content is greater than 200 ppm, without oxidation of the copper-based conductors therein.

10 Claims, No Drawings

METHOD OF MAKING MULTILAYERED CERAMIC STRUCTURES HAVING AN INTERNAL DISTRIBUTION OF COPPER-BASED CONDUCTORS

BACKGROUND OF THE INVENTION

1. FIELD OF THE INVENTION

The present invention is concerned with techniques which can be used to produce multilayered ceramic structures containing copper-based conductors.

2. BACKGROUND OF THE INVENTION

Multilayered glass-ceramic structures are used in the production of electronic substrates and devices. Many different types of structures can be used, and a few of these structures are described below. For example, a multilayered ceramic circuit substrate may comprise metal layers which act as patterned electrical conductors sandwiched between ceramic layers which act as insulators. The substrates may be designed with termination pads for attaching semiconductor chips, connector leads, capacitors, resistors, covers, etc. Interconnection between buried conductor levels can be achieved through so-called "vias" formed by metal paste filled holes in the individual glass-ceramic layers formed prior to lamination, which, upon sintering, will become a sintered dense metal interconnection of copper-based conductor.

In general, conventional ceramic structures are formed from ceramic green sheets which are prepared by mixing a ceramic particulate, a thermoplastic polymer binder, and solvents. This composition is spread or cast into ceramic sheets or slips from which the solvents are subsequently volatilized to provide coherent and self-supporting flexible green sheet. The green sheet is eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Use of copper-based conductors in the multilayered structures requires the use of process techniques which do not oxidize the copper during the removal of binder resin and solvents, and sintering of the ceramic particulates together into the densified ceramic substrate. Many of the methods proposed for making the multilayered glass-ceramic structures call for firing of the green sheet in an inert atmosphere such as nitrogen, to avoid oxidizing the copper-based conductors in the structure. This frequently results in incomplete decomposition of the binder resin or the formation of carbonaceous residue within the structure, thereby deteriorating the mechanical strength and dielectric properties (including electrical insulation) of the structure.

U.S. Pat. No. 4,234,367 to Lester W. Herron et al. discloses a method for forming sintered glass-ceramic substrates containing multilevel, interconnected thick film circuit patterns of copper-based conductors. These substrates are obtained by firing the glass-ceramic in a controlled ambient of hydrogen and water at temperatures below the melting point of copper. The controlled ambient as defined by Herron et al. is slightly reducing to copper but highly oxidizing to carbon at all times, so the resin binder can be removed while producing substrates with non-oxidized metallic copper.

U.S. Pat. No. 4,079,156 to Youtsey et al. discloses a method of preventing oxidation of the non-noble conductive metal, wherein the metal is alloyed with at least one oxidizable material which is preferentially oxidized during the firing of thick film electronic components in an oxidative atmosphere.

U.S. Pat. No. 4,474,731 to Brownlow et al. discloses a process for the removal of carbon residues during sintering of ceramics wherein a pyrolysis catalyst is utilized to permit binder resin removal in a low oxygen atmosphere without the accumulation of carbonaceous residue. In the case of copper, the pyrolysis ambient is disclosed as containing hydrogen and water vapor ratios within a specified range in order to minimize the oxidation of the copper.

U.S. Pat. No. 4,504,339 to Kamehara et al. discloses a method for producing a multilayered glass-ceramic structure with copper-based conductors therein, wherein the multilayered structure is fired in an inert atmosphere containing water vapor, the partial pressure of which is from 0.005 to 0.3 atmosphere.

U.S. Pat. No. 4,517,155 to Prakash et al. discloses a method of producing copper end terminations on multi-electrode ceramic capacitors, wherein the capacitor is fired in an atmosphere of nitrogen which contains a controlled partial pressure of oxygen. The recommended atmosphere, during burn-out of the organic binders contained in the structure, is comprised of nitrogen containing from between 20 and 200 ppm of oxygen. About 50–150 ppm of oxygen is preferred during the initial burn-out step. Higher partial pressures of oxygen are said to lead to oxidation of the copper constituent, resulting in increased resistivity and poor solderability of the fired termination.

Thus, the patents described above depend on the use of neutral ambients, control of ambient oxygen content to about 200 ppm or less, or alloying of the copper with an oxygen scavenger to prevent copper oxidation during glass ceramic or ceramic binder/vehicle burn out. It would be desirable to have a method of producing multilayered ceramic structures with copper-based conductors which permits the use of ambients containing oxygen contents above the 200 ppm level, to permit the rapid removal of binder resin at lower temperatures via oxidative degradation. It would be desirable to have a method of producing such structures in an ambient which does not contain water vapor, since the presence of water vapor causes bloating and porosity of the coalesced glass-ceramic/ copper laminate if process conditions are not carefully controlled. In addition, typically the onset of sintering of a copper-based conductor takes place at temperatures ranging from about 250° C. to 400° C., whereas sintering of the ceramic takes place at about 800° C. This difference in sintering temperature presents dimensional control problems during processing of the multilayer structure. It would be desirable to have a method of increasing the temperature at which the copper-based metallurgy sinters, so that it more nearly matches that at which the ceramic sinters.

SUMMARY OF THE INVENTION

In accordance with the present invention, a method is provided for producing multilayered ceramic structures having copper-based conductors therein, whereby the polymeric binder resin used in formation of the ceramic portion of the structure can be removed or burned-off using molecular oxygen-containing ambients comprising above 200 ppm molecular oxygen without oxidation of the copper-based conductors therein. The present invention also provides a method of increasing the temperature at which the sintering of the copper-based metallurgy begins, so that this temperature can be more closely matched to that at which the ceramic portion of the structure begins to sinter.

We have discovered that the polymeric binder resin of the ceramic portion of a glass ceramic structure can be burned-off in an oxidative atmosphere comprising up to about 5% by volume oxygen without permanent oxidation of the copper-based conductors therein. The binder burn-off is carried out at temperatures up to about 600° C. Subsequent to the polymeric binder resin burn-off, the minor copper oxidation which has occurred can be reversed by treatment in a reducing atmosphere, such as forming gas, at temperatures ranging between about 300° C. and about 600° C.

In addition, application of a conformal coating of the proper polymeric material to the copper-based particles used to make up the metallurgy precursor (typically the metallurgy precursor is a paste comprising the copper-based particles, a polymeric binder, a solvent and a surfactant) enables both an increase in the sintering temperature of the copper-based metallurgy as well as ceramic green sheet binder burn-off in an oxidizing atmosphere comprising molecular oxygen contents even greater than 5% by volume. Use of atmospheres comprising molecular oxygen contents of 50% have been demonstrated and contents up to at least 100% appear useful. When binder burn-off is conducted in highly oxidizing ambients, the conformal coating of polymeric material must be thermally stable, i.e. not thermally decompose to a significant degree, to a temperature which permits ceramic green sheet binder burn-off, while maintaining at least a surface isolation of the copper-based particles from the oxidizing atmosphere; or, the conformal coating of polymeric material must decompose to a conformal composition capable of protecting the copper-based particles from oxidation.

Organometallic polymers comprising a metal, which upon decomposition in an oxidizing atmosphere, produces metal oxides, metal carbides, or metaloxycarbides capable of protecting the copper-based metallurgy particle from oxidation, provide one of the preferred conformal coatings in the method of the present invention. These organometallic polymers comprise metals such as Group III A metals, Group IV A metals, Group IV B metals, and Group VI B metals. An example of a Group III A metal is aluminum. Examples of Group IV A metals are tin, germanium, and silicon. Examples of Group IV metals are titanium and zirconium. Examples of Group VI B metals are tungsten and molybdenum. The preferred metallic portions of the organometallic polymer are titanium, silicon, and tin, with the most preferred being silicon.

Polymers which have thermal stability at least to the temperature at which binder burn-off is carried out, or which decompose to provide an acceptable conformal coating include, for example, polyimides, maleimides, polyquinoxalines, polyphenyls, acetylene-terminated polyimides, acetylene-terminated polyisoimides, copolymers comprising imide and siloxane moieties, and silicones.

Among the preferred polymeric materials which can be applied to provide the thermally stable conformal coating are polymers such as polyimide precursors in the form of acetylene-terminated polyisoimides. Among the preferred polymeric materials which decompose to provide acceptable conformal coatings are copolymers comprising imide and siloxane moieties, and silicone resins.

When a polyimide conformal coating is used to protect the copper-based particles of the metallurgy precursor during ceramic binder burn-off, the multilayered structure is fired in an oxidizing atmosphere at a temperature adequate to provide decomposition of the ceramic binder resin while permitting maintenance of sufficient conformal coating to protect the copper-based particles. Any conformal coating remaining on the copper-based particles after binder burn-off is removed during the sintering of the ceramic portion of the structure. This sintering is carried out in an inert or reducing atmosphere. Very small amounts of carbon are formed in the copper-based metallurgy, but these are insufficient to significantly affect the copper-based metallurgy density or electrical properties.

When a silicon-containing polymeric conformal coating is used to protect the copper-based particles of the metallurgy precursor, the multilayered structure is fired in an oxidizing atmosphere at a temperature adequate to provide decomposition of the ceramic binder resin and to decompose the polymeric portion of the conformal coating so that a metal oxide, metal carbide, or metaloxycarbide remains on the surface of the copper-based metallurgy precursor particles.

The conformal coating remaining on the copper-based particles, whether polymeric in nature or a metallic oxide, metallic carbide, or metaloxycarbide, acts not only to prevent oxidation of the copper, but also prevents sintering of the copper-based metallurgy precursor up to the temperature at which such conformal coating decomposes or deteriorates adequately to permit the copper-based metallurgy to sinter.

After the ceramic binder resin burn-off, the multilayered structure is fired in an inert or reducing atmosphere to a temperature adequate to permit removal of any residual conformal coating as well as sintering of the copper-based metallurgy and the ceramic portions of the multilayer structure. Use of a reducing atmosphere is preferred for the initial low temperature portion of the firing period, to enable the reduction of any slightly oxidized copper back to metallic copper.

When the presence of the thermally stable polymeric material has the sole purpose of increasing the temperature at which the onset of sintering of the copper-based metallurgy precursor occurs, it is not necessary that the thermally stable polymeric material conformally coat all copper surfaces. In fact, if the process ambient is not oxidizing, only partial coating of the copper surfaces or contact of the thermally stable polymeric material with portions of the copper-based metallurgy precursor is adequate.

DESCRIPTION OF THE PREFERRED EMBODIMENTS

Data in the literature, and in U.S. Pat. No. 4,517,155, have indicated that the presence of molecular oxygen during burn-off of the ceramic green sheet binder resin, wherein molecular oxygen concentrations exceed a few hundred parts per million, results in unacceptable oxidation of the copper metallurgy contained in the multilayer ceramic structure.

We have discovered that molecular oxygen contents up to 5% by volume of the ambient can be used during the burn-off of the ceramic green sheet binder resin without significant oxidation of the copper-based metallurgy. Depending on the oxygen concentration, there may be slight oxidation of the copper-based metallurgy; however, such minor oxidation can be reversed by subsequent firing of the multilayer ceramic structure containing copper-based metallurgy in a reducing atmosphere, such as forming gas.

EXAMPLE I

To determine the effect of the amount of molecular oxygen present (during burn-off of the glass ceramic green sheet binder resin) on the copper-based metallurgy, the following experiment was carried out:

Copper pellets were prepared by compressing coated copper particles, wherein the average particle size of the copper particles was about 3 micrometers and the coating on the copper particles was comprised of polyvinylbutyral ranging from about 0.5 to about 1.0% by weight of the coated copper particle.

The compressed pellets were placed on a tray of ceramic tiles and the tray was placed in a glass tube furnace about 6 in. in diameter and about 6 ft. long. A gas mixture of about 3% oxygen by volume in nitrogen was passed through the tube furnace at a rate of about 5 liters per minute throughout the entire process. Heat was applied to the furnace so that the temperature increased at a rate of about 1° C./min from ambient (25° C.) to 450° C. The furnace was held at 450° C. for about 5 hours and then cooled to ambient at a rate of about 2° C./min. After cooling, differential weight calculations indicated that about 2% of the copper had been oxidized.

Repetitive experiments indicated that between 2% and 7% of the copper had been oxidized, depending on variables such as the thickness of the polyvinylbutyral coating on the copper particles. The 2% to 7% oxidation is undesirable due to the porosity in copper metallurgy produced from the oxidized copper which decreases the electrical conductivity.

We then processed additional copper pellets through a similar process to that described above, wherein molecular oxygen was present at about 5% by volume in nitrogen, and the holding time at 450° C. was decreased to about 1 hour. After holding the pellets for 1 hour at 450° C., the gas mixture to the glass tube furnace was changed to a less oxidizing atmosphere comprising about 3% molecular oxygen, and molecular hydrogen ranging from about 0.5% to about 5.0% by volume in nitrogen. The temperature of the furnace was increased at a rate of about 3° C./minute to about 600° C. and held at about 600° C. for about 1 hour. The amount of copper oxidation was reduced without adversely affecting the binder removal from MLC bodies by addition of the hydrogen to the gas mixture. Differential weight analysis of samples taken at this point in the process indicated copper oxidation of less than 2% by weight. However, this amount of copper oxidation is still undesirable in terms of porosity and reduced electrical conductivity of the copper-based metallurgy produced.

Subsequent to the binder burn-off processing above, the copper pellets were treated with a reducing atmosphere to reduce any copper oxide back to the metallic state. This was accomplished by holding the furnace at 600° C. and changing the gas mixture to forming gas. The pellets were treated with forming gas for a period of about one hour. Then the furnace was cooled to room temperature in the presence of the reducing atmosphere at a rate of about 2° C./min.

After treatment in the reducing atmosphere, microstructural analysis and X-ray analysis indicated that no polyvinylbutyral remained, and no oxidized copper could be detected.

We then prepared a 28 layer glass-ceramic green sheet structure containing copper-based metallurgy using relatively standard techniques known in the art. The multilayered green sheet structure was processed through the process cycle previously described, wherein the initial molecular oxygen concentration was about 5% by volume, the molecular oxygen content was reduced to about 3% by volume with about 5% molecular hydrogen, by volume, and wherein a reducing atmosphere was used to reduce any oxidized copper back to the metallic state, as previously described. Subsequently, the glass-ceramic green sheets were sintered in nitrogen. The nitrogen flow rate in the furnace was 5 liters/minute, the rate of temperature increase was about 5° C./minute from 600° C. to 965° C., and the multilayered structure was held at 965° C. for about a 2 hour period. Cooling to room temperature was done in nitrogen at a average rate of about 5° C./min.

The density of the resultant ceramic was 2.55 g/cc as compared with 2.45 g/cc observed for a multilayered structure processed using the method described in U.S. Pat. No. 4,234,367 to L.W. Herron et al. The resistivity of the resultant copper-based metallurgy was 3.5 ohm cm.

The above data indicates the use of molecular oxygen up to about 5% by volume during burn-off of the ceramic green sheet binder resin is acceptable if the binder burn-off process is followed by treatment of the multilayered structure in a reducing atmosphere.

During the formation of multilayered glass ceramic structures containing copper-based conductors, typically the onset of copper sintering begins at about 250° C. to 400° C., whereas the ceramic sintering occurs over the range from 780° C. to about 900° C. The burn-out temperature for the polymeric binder resin of the ceramic green sheet depends on the particular binder polymer itself. In order to coordinate all of the process steps into one working system, it is desirable to have the sintering onset temperature of the copper-based metallurgy be as near as possible to that of the sintering temperature of the ceramic and to be able to burn off the binder resin of the ceramic green sheet in an oxidizing atmosphere without affecting the electrical properties of the copper-based metallurgy.

Application of the proper polymeric material to the surfaces of the copper-based particles of the metallurgy precursor makes possible both an increase in the sintering temperature of the copper-based metallurgy as well as binder burn-off in an oxidizing atmosphere. To prevent oxidation of the copper-based conductors, the polymeric material must be thermally stable to a temperature which permits ceramic green sheet binder burn-off while maintaining at least a surface isolation of the copper-based particles of the metallurgy precursor from the oxidizing atmosphere, i.e. a passivating coating; or, the polymeric material must decompose to a conformal coating composition capable of protecting the copper-based particles of the metallurgy precursor from oxidation. Preferred embodiment polymers which have demonstrated such conformal coating capabilities include polyimides, maleimides, polyquinoxalines, polyphenyls, acetylene terminated polyimides, acetylene terminated polyisoimides, copolymers comprising imide and siloxane moieties, and silicones.

The ceramic green sheet binder polymer can be any of the polymeric binder materials known in the art. However, it is a particular advantage to have the polymeric binder material be an "unzippable" polymer. An unzippable polymer is hereby defined as one, which pyrolyzes to yield a monomeric gas directly from the solid polymer, without the formation of significant amounts of high molecular weight gels which give rise to carbonaceous residues (tars, chars; etc.). Typically, the unzippable polymer is a long-chained organic compound that undergoes scission to its monomeric units upon decomposition. Examples of unzippable polymers include polymethyl methacrylate, poly($\alpha$-methyl vinyl pyridine) polyvinylpyridine, polyisobutylene, poly($\alpha$-methylstyrene), poly(perfluoroethylene) and other polymers which have the repeating structure

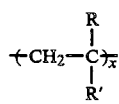

where R is an alkyl of the general formulation $C_nH_{2n+1}$ wherein n varies from 1 to about 4; or R is an aryl, i.e., either the six-carbon rings of benzene or the condensed six-carbon rings of other aromatic derivatives, for example phenyl or napthyl; or R is an electron withdrawing functional group such as —COOR, —CN, or —NO$_2$; where R is not H, and where R' is the same as or different from R, but selected from functional groups of the same general formulation; and where x is the number of monomeric units joined to form the polymer.

Among the thermally stable polymeric materials which can be used as described above are polyimide precursors in the form of acetylene-terminated polyisoimides. A typical acetylene terminated polyisoimide is shown in the formulation below:

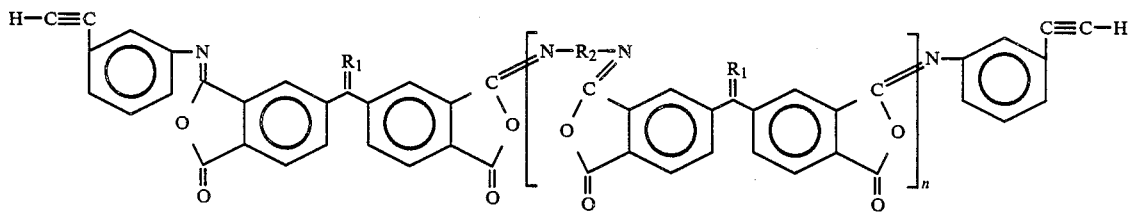

or above.

where R$_1$ includes, but is not limited to —C=O, —S=O, —O—; and where R$_2$ may be any one of a number of functionalities, including but not limited to:

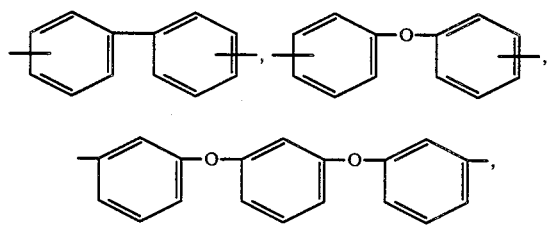

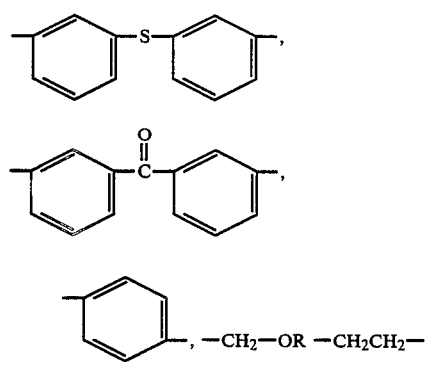

, —CH$_2$—OR —CH$_2$CH$_2$—

Additional types of iosimide-containing oligomers which can be used to practice the present invention are described in U.S. Pat. No. 4,485,231 to Landis, which is hereby incorporated by reference. An adhesion promoter comprising a silane or titanate is first applied to the copper-based particles to be used in the metallurgy precursor. Then the acetylene terminated polyisoimide is applied to the copper-based particles. Subsequently the polyisoimide coating is converted to an imide and crosslinked through at least the acetylene end groups by the application of heat in an inert atmosphere. The polyimide-coated, copper-based particles are then incorporated into the copper-based metallurgy precursor, which is typically a paste, as is known in the art, which can be screened through a mask to provide a pattern upon a substrate such as the glass-ceramic green sheet substrate. The imidized, crosslinked polymer coating on the copper-based particles which exhibits particularly high thermal stability, protects the surface of the copper-based particles during burn-off of the ceramic green sheet binder in an oxidative atmosphere. In addition, the temperature at which sintering of the copper-based metallurgy precursor takes place is increased to that at which the imidized, crosslinked polymer decomposes,

EXAMPLE 2

A dispersion was made comprising:

(a) copper particles with an average particle size of about 3 micrometers which had been treated with an adhesion promoter. In this particular case, the adhesion promoter was $\gamma$ aminopropyl-triethoxysilane, however any silane or titanate-based adhesion promoter should suffice, (b) a solution of acetylene-terminated polyisoimide (Thermid IP-600 from National Starch Corp.). The solution of IP-600 was about 5% by weight solids in tetrahydrofuran (THF), although diglyme, cyclohexanone, an acetone-toluene mixture, or other solvents such as aprotic solvents and etheral solvents, can be used in place of THF. The amount of solution added to the dispersion was such that the concentration of polyisoimide was about 5% by weight of the copper, although polyisoimide concentrations ranging from about 1% by weight of the copper to about 5% by weight of the copper have produced coated copper particles which function well within the present invention.

A non-solvent for the polyisoimide, hexane, was added to the dispersion to cause the polyisoimide to precipitate from the solution of THF onto the surface of the copper particles. Subsequently, the coated copper particles were filtered from the dispersion. THF solvent remaining on the coated particles was removed by evaporation under reduced pressure. It is not necessary, but is preferred to wash the coated particles with a non-solvent for the polymeric coating material, followed by removal of residual solvents by evaporation. The resultant coated copper particles comprised about 2.5% polyisoimide, which corresponds to a coating thickness of about 0.1 micrometer on the average.

This method of applying a coating to the copper particles can be used for any of the polymeric materials described in the present invention.

Spray drying was also used as a method of producing coated/encapsulated copper particles. Either technique works; however, precipitation of the polymer from solution onto the copper particle surface is preferred due to the uniformity of the coating achieved.

The "dried" coated copper particles were heated in nitrogen at about 350° C. for a period of about 2 hours, to achieve imidization and crosslinking of the polyisoimide. The coated copper particles were evaluated using thermogravimetric analysis (TGA) for stability in an oxidative atmosphere. In addition, the coated particles were fired at various temperatures and the resultant copper structures were examined to determine the retardation of sintering of the copper resulting from the crosslinked polyimide coating.

TGA data for the coated copper particles demonstrated oxidative stability of the particles temperatures ranging from about 500° C. to about 700° C. depending on the thickness of the polymer coating on the copper particle. Untreated copper commences to oxidize at about 200° C., whereas the coated copper particles did not show any appreciable indication of oxidation (weight gain) until about 500°–700° C. Subsequent to determination of oxidative stability, the copper particles were sintered in a nitrogen atmosphere, although any inert or reducing atmosphere would suffice, and the temperature of sintering appeared to be about 780° C. to 790° C.

Additional polymeric materials which can be used to protect the copper from oxidation during burn-off of the ceramic binder resin, and which provide advantages in terms of increasing the temperature at which the onset of sintering of the copper-based metallurgy occurs, include metal-containing resins as previously described, such as silicon-containing resins. These metal-containing resins decompose in an oxidizing atmosphere to form metallic oxides on the surface of the copper, protecting the copper itself from oxidation. Silicon-containing resins decompose to form silicon oxides, silicon carbides and silicon oxycarbides on the surface of the copper. These decomposition products protect the copper from oxidation and prevent premature sintering of the copper metallurgy.

Among the silicon-containing organometallic materials, in particular, copolymers comprising imide and siloxane moieties wherein the siloxane portion of the copolymer functions as an internal plasticizer are preferred. Such copolymers can be random or block copolymers.

Copolymers comprising imide and siloxane moieties have been shown to be especially effective in protecting the copper surfaces from oxidation during binder burn-off. Examples of such resins which are commercially available include M&T 2065 and M&T 4605, available from M&T Chemicals Inc., and RC-2566 available from DuPont Chemicals.

EXAMPLE 3

A solution of M&T 2065 siloxane modified polyimide resin at about 5% by weight in diglyme was prepared. The solution was combined with copper powder of about 3 micrometer average particle size distribution, which had been treated with an adhesion promoter, to form a dispersion as described in Example 2. Coated copper particles were obtained from the dispersion using the same technique as that described in Example 2. Although other methods of coating application provided a satisfactorily coated copper particle with an average particle size distribution between about 3 and about 5 micrometers, the most uniformly coated particles were achieved by precipitation of polymer from solution onto the copper particle surface.

There were three forms of the copper powder each of which was used to make a dispersion with siloxane modified polyimide solution, they included:

(1) untreated copper powder (2) copper powder cleaned using a mild acid etch of dilute $HNO_3$ for a period of about 15 minutes (3) a copper powder treated with an adhesion promoter, such $\gamma$ aminopropyltriethoxysilane or 4-aminophthalonitrile.

All three forms of the copper powder can provide a coated copper particle which performed satisfactorily in the evaluation of copper metallurgy produced using the coated copper particles. However, in order to insure a conformal coating, it is most preferred to use an acid etched copper particle and an adhesion promoter which serves as a coupling agent between the copper-based metallurgy precursor particles and the conformal coating polymeric material. In cases where the conformal coating polymeric material is a polyimide, preferred adhesion promoters include aluminum chelates and amine-terminated silanes.

The siloxane modified polyimide conformal coating on the copper particles was cured using the following schedule: 100° C. for 30 minutes, followed by 200° C. for 30 minutes, followed by 300° C. for about 2 hours. During "cure" any residual low molecular weight organic compounds are volatilized and removed, resulting in reduced solubility of the coating and increased thermal stability. After cure of the coating on the copper particles, the coated copper particles were compressed into pellets which were exposed to an oxidizing atmosphere and then sintered in forming gas, which is comprised of about 10% hydrogen and about 90% nitrogen.

Table 1 (below) shows dynamic thermogravimetric analysis data for pelletized copper particles both uncoated and coated with the siloxane modified polyimide. The ambient was air, and the heating rate was 10° C./minute.

TABLE 1

| Maximum Temperature °C. | % Weight Gain | |
|---|---|---|
| | uncoated | coated with siloxane modified polyimide |
| 400 | 6.5 | none |
| 450 | 10 | none |
| 550 | 23 | 2 |
| 600 | 24 | 3.5 |
| 650 | 24 | 8.0 |

A weight gain of 24% represents complete oxidation of the pellitized copper. Coated copper pellets exhibiting a weight gain of about 6% upon exposure to the oxidizing atmosphere, were subsequently sintered at about 965° C. in forming gas and yielded copper metallurgy ranging between about 89% and about 94% of theoretical density. This density correlates well with the density which is obtained when the coated copper particles are incorporated into a typical metallurgy paste which is used in the actual production of multilayered glass ceramic structures containing copper-based conductors.

When at least one of the purposes of the conformal coating on the copper particles is to prevent oxidation of the copper during burn-off of the ceramic green sheet binder resin, it is critical that the thickness of the coating be adequate to survive the thermal processing conditions without exposing the copper to ambient. Although the following is very preliminary data, and not intended to be limiting, our experience has been that a coating thickness ranging between about 0.02 micrometers and about 0.1 micrometer is preferred. This corresponds to a coating comprising from about 0.5% to about 4.0 % by weight of the coated copper particle It is possible to use thicker coatings, but a thicker coating results in more polymeric residue to be removed prior to or during sintering of the copper metallurgy, and too thick a coating may preclude sintering of the copper metallurgy.

When the presence of the thermally stable polymeric material has the sole purpose of increasing the temperature at which the onset of copper metallurgy sintering occurs, it is not necessary for the coating to be as thick, in fact, if the processing ambient is not oxidative, it is not necessary that the particles be completely coated, i.e. that the coating be conformal.

Other silicon-containing polymeric materials which can be used to protect the copper metallurgy during burn-off of the ceramic binder resin include commercially available silicone polymers. The silicone polymers can be applied to the surface of the copper particles by the same techniques as those described previously for coating the copolymers comprising imide and siloxane moieties. In addition, the technique of dry blending the silicone resin into the copper metallurgy formulation to permit adsorption of the silicon polymer onto the copper surface is also a particularly useful coating technique.

EXAMPLE 4

A number of different silicone resins were each dry blended into a copper metallurgy formulation comprising about 1 to about 2% resin and about 98% to about 100% copper. Dry blending provided a coating on the copper particle by direct adsorption. The dry blend was pelletized and the pellets were exposed to an atmosphere of 50:50, nitrogen:oxygen, at a temperature of 400° C. for a period of one hour. Subsequently the pellets were sintered in forming gas at a temperature of about 960° C. Table 2 shows the weight gain of the pellets during exposure to the oxidizing atmosphere, as well as the % of the metallurgy theoretical density obtained after sintering.

TABLE 2

| Type of Silicone Polymer | % by Weight of Copper in Dry Blend | % Weight Gain After Oxidation | % Theoretical Density After Sintering |
|---|---|---|---|
| SR 125 | 1 | 4.0 | 87 |
| SR 240 | 1 | 4.2 | 86 |
| GE 355 | 2 | 6.3 | 80 |
| GE 350 | 1 | 6.9 | 78 |
| GE 350 | 2 | 5.1 | — |

A weight gain of 9% is typical for uncoated copper particles under these conditions. Both the SR and GE silicon polymers are available from General Electric Co. The coating of silicone polymer not only prevents oxidation of the copper, but also retards the onset of sintering of the copper. This prevents sintering of the copper until a temperature closer to that at which the ceramic sinters and may permit cosintering with the ceramic, depending on the particular silicone polymer used for the coating. Use of polymer coatings of high silicon content such as the silicon polymers above results in a lower density metallurgy due to the presence of the silicon metal.

Only the preferred embodiments of the invention have been described in the above examples, and one skilled in the art will recognize that numerous substitutions, modifications and alterations are permissible without departing from the spirit and scope of the invention, which is demonstrated in the following claims.

What is claimed is:

1. A method of forming a multilayer ceramic packaging structure having an internal pattern of copper-based metal conductors therein comprising the steps of:
    preparing a plurality of greensheets of at least a ceramic or glass-ceramic material and an organic binder material;
    coating particles of said copper-based metal with an organometallic polymer material which decomposes to form a decomposition product which provides a conformal layer about said metal particles;
    preparing a conductor paste comprising at least said coated metal particles and a binder;
    applying a pattern of said conductor paste to said plurality of greensheets;
    stacking and laminating said plurality of metallized greensheets;
    heating said metallized greensheets in an oxidizing ambient to a first temperature sufficient to effect removal of said organic binder material from said greensheets but not sufficient to effect removal of said conformal layer;
    substituting an inert ambient for said oxidizing ambient; and
    firing said metallized greensheets in said inert ambient to a second temperature sufficient to coalesce said ceramic or glass-ceramic materials and to sinter said conductors but not sufficient to melt said conductors.

2. The method of claim 1, wherein said organometallic polymer comprises metals selected from the group comprising aluminum, tin, germanium, silicon, titanium and zirconium.

3. The method of claim 1, wherein said organometallic polymer comprises a silicon-containing polymer and wherein said decomposition product forms a silica layer about said metal particles.

4. A method of forming a multilayer ceramic packaging structure having an internal pattern of copper-based metal conductors therein comprising the steps of;

preparing a plurality of greensheets of at least a ceramic or glass-ceramic material an organic binder material;

coating particles of said copper-based metal by precipitating a polymeric material from a solution of said polymeric material onto the surface of said metal particles suspended or dispersed in said solution of said polymeric material;

preparing a conductor paste comprising at least said coated metal particles and a binder;

applying a pattern of said conductor paste to said plurality of greensheets;

stacking and laminating said metallized greensheets;

heating said metallized greensheets in an oxidizing ambient to a first temperature sufficient to effect removal of said organic binder material from said greensheets but not sufficient to effect removal of said coating;

substituting an inert ambient for said oxidizing ambient; and firing said metallized greensheets in said inert ambient to a second temperature sufficient to coalesce said ceramic or glass-ceramic materials and to sinter said conductors but not sufficient to melt said conductors.

5. The method of claim 4, wherein a non-solvent for said polymeric material is added to said solution to cause said polymeric material to precipitate onto said metal particles.

6. The method of claim 5, wherein said metal particles are treated with an adhesion promoter prior to precipitation of said polymeric material onto said metal particles.

7. The method of claim 6 wherein said metal particles are comprised of copper.

8. The method of claim 7 wherein said copper particles are etched in a dilute acid prior to treatment with an adhesion promoter.

9. A method for producing a multilayered glass-ceramic or ceramic structure with at least one copper-based conductor therein, comprising the steps of:

forming a multilayered structure with at least one copper-based conductor metallurgy precursor therein, and comprising at least one glass ceramic greensheet comprising an organic binder resin, wherein the surfaces of copper particles contained in said copper-based conductor precursor are conformally coated by an organometallic polymer material which decomposes to provide a thermally stable decomposition product conformally coating said conductors; and firing said multilayered structure in an oxidizing atmosphere at a temperature adequate for at least substantial decomposition of said ceramic greensheet binder resin.

10. The method of claim 9 wherein said organometallic polymer comprises a silicon-containing polymer.

* * * * *